(12) United States Patent
Miller et al.

(10) Patent No.: US 11,762,134 B2
(45) Date of Patent: Sep. 19, 2023

(54) DIFFRACTIVE OPTICAL ELEMENT

(71) Applicant: Lumentum Operations LLC, San Jose, CA (US)

(72) Inventors: John Michael Miller, Gatineau (CA); Stephen Bagnald, Ottawa (CA)

(73) Assignee: Lumentum Operations LLC, San Jose, CA (US)

( * ) Notice: Subject to any disclaimer, the term of this patent is extended or adjusted under 35 U.S.C. 154(b) by 53 days.

(21) Appl. No.: 17/303,194

(22) Filed: May 24, 2021

(65) Prior Publication Data

US 2021/0278576 A1  Sep. 9, 2021

Related U.S. Application Data

(63) Continuation of application No. 16/040,223, filed on Jul. 19, 2018, now Pat. No. 11,016,227.

(60) Provisional application No. 62/559,982, filed on Sep. 18, 2017.

(51) Int. Cl.
| | |
|---|---|
| *G02B 5/18* | (2006.01) |
| *G02B 1/118* | (2015.01) |
| *G02B 27/42* | (2006.01) |
| *G03F 7/00* | (2006.01) |
| *G03F 7/20* | (2006.01) |

(52) U.S. Cl.
CPC ............ *G02B 5/1809* (2013.01); *G02B 1/118* (2013.01); *G02B 5/1819* (2013.01); *G02B 5/1866* (2013.01); *G02B 5/1876* (2013.01); *G02B 27/4205* (2013.01); *G03F 7/001* (2013.01); *G03F 7/70308* (2013.01)

(58) Field of Classification Search
CPC .... G02B 5/1809; G02B 1/118; G02B 5/1819; G02B 5/1866; G02B 5/1876; G02B 27/4205; G02B 5/18; G02B 5/3083; G02B 5/1814; G03F 7/001; G03F 7/70308
See application file for complete search history.

(56) References Cited

U.S. PATENT DOCUMENTS

| | | | |
|---|---|---|---|
| 4,895,790 | A | 1/1990 | Swanson et al. |
| 5,171,414 | A | 12/1992 | Amberger et al. |
| 5,218,471 | A | 6/1993 | Swanson et al. |
| 7,961,393 | B2 | 6/2011 | Perkins et al. |

(Continued)

FOREIGN PATENT DOCUMENTS

| | | |
|---|---|---|
| CN | 1576891 A | 2/2005 |
| CN | 101688938 A | 3/2010 |

(Continued)

OTHER PUBLICATIONS

Arbabi A., et al., "Subwavelength-Thick Lenses with High Numerical Apertures and Large Efficiency Based on High Contrast Transmitarray," Oct. 30, 10 pages.

(Continued)

*Primary Examiner* — Kimberly N. Kakalec
(74) *Attorney, Agent, or Firm* — Harrity & Harrity, LLP

(57) ABSTRACT

A diffractive optical element may include sub-wavelength period stack-and-gap structured layers providing transmissive phase delay at a wavelength. The sub-wavelength period stack-and-gap structured layers may include a set of thin anti-reflection layers that are index matched to an environment or a substrate over a range of fill factors of the sub-wavelength period.

20 Claims, 13 Drawing Sheets

(56) References Cited

U.S. PATENT DOCUMENTS

| | | | |
|---|---|---|---|
| 8,749,903 | B2 | 6/2014 | Yamada et al. |
| 9,239,467 | B2 | 1/2016 | Shpunt et al. |
| 9,557,461 | B2 | 1/2017 | Lochbihler et al. |
| 10,094,961 | B2 | 10/2018 | Speckbacher et al. |
| 11,016,227 | B2 | 5/2021 | Miller et al. |
| 2004/0263981 | A1 | 12/2004 | Coleman et al. |
| 2007/0070276 | A1 | 3/2007 | Tan et al. |
| 2007/0103782 | A1 | 5/2007 | Lee et al. |
| 2008/0074748 | A1 | 3/2008 | Kittaka et al. |
| 2012/0194912 | A1* | 8/2012 | Faraon ................ G02B 5/1819 359/573 |
| 2014/0044392 | A1 | 2/2014 | Fattal et al. |
| 2016/0306167 | A1 | 10/2016 | Mossberg et al. |
| 2017/0168202 | A1 | 6/2017 | Mossberg et al. |
| 2017/0205547 | A1 | 7/2017 | Lochbihler |
| 2017/0235153 | A1 | 8/2017 | Lee-Bouhours et al. |
| 2018/0128948 | A1 | 5/2018 | Iazikov et al. |
| 2019/0064532 | A1 | 2/2019 | Riley, Jr. et al. |

FOREIGN PATENT DOCUMENTS

| | | | |
|---|---|---|---|
| CN | 101730857 | A | 6/2010 |
| CN | 103534622 | A | 1/2014 |
| CN | 105891925 | A | 8/2016 |
| CN | 106574996 | A | 4/2017 |
| CN | 106959478 | A | 7/2017 |
| JP | 2007234094 | A | 9/2007 |
| WO | 2005038501 | A1 | 4/2005 |

OTHER PUBLICATIONS

Capasso F., et al., "The future and promise of flat optics: a personal perspective", Nanophotonics, Feb. 14, 2018, vol. 7 (6), pp. 953-957.

Chen W.T., et al., "A Broadband Achromatic Metalens for Focusing and Imaging in the Visible", Nature Nanotechnology, Jan. 1, 2018, vol. 13 (3), pp. 220-226.

Chen W.T., et al., "A broadband achromatic polarization-insensitive metalens consisting of anisotropic nanostructures", Nature Communications, 2019, vol. 10 (Article 355), 7 pages.

Devlin R.C., et al., "Broadband high-efficiency dielectric metasurfaces for the visible spectrum", Proceedings of the National Academy of Sciences of the United States of America, Sep. 6, 2016, vol. 113 (38), pp. 10473-10478.

Khorasaninejad M., et al., "Metalenses at visible wavelengths: Diffraction-limited focusing and subwavelength resolution imaging", Science Applied Optics, Jun. 3, 2016, vol. 352 (6290), pp. 1190-1194.

Khorasaninejad M., et al., "Polarization-Insensitive Metalenses at Visible Wavelengths", Nano Letters, 16, 11, pp. 7229-7234.

Macleod H.A., "Thin-Film Optical Filters," http://kashanu.ac.ir/Files/thin%20film%20optical%20filter(macklod).pdf, 2001, 667 pages.

Optics & Photonics News, "Subwavelength Photonics," May 2017, 8 pages.

Pahlevaninezhad H., et al., "Nano-optic Endoscope for High-resolution Optical Coherence Tomography in Vivo", Nature Photonics, Jul. 30, 2018, vol. 12, pp. 540-547.

Turunen J., et al., "Diffractive Optics for Industrial and Commercial Applications," 1997, 3 pages.

Wendt J.R., et al., "Nanofabrication of Subwavelength, Binary, High Efficiency Diffractive Optical Elements in GaAs," Aug. 1, 1995, 4 pages.

* cited by examiner

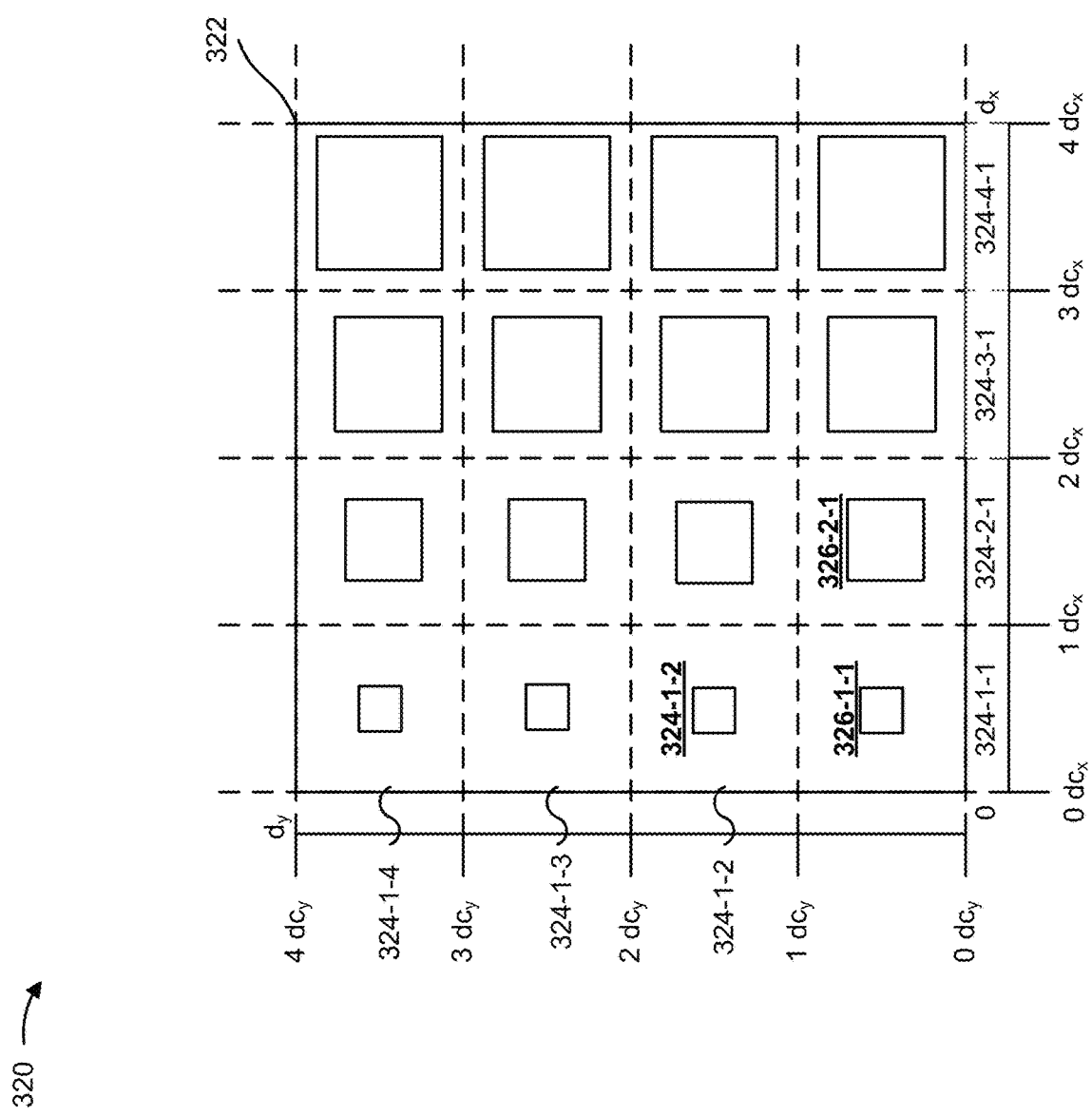

DIFFRACTIVE OPTICAL ELEMENT

RELATED APPLICATION(S)

This application is a continuation of U.S. patent application Ser. No. 16/040,223, filed Jul. 19, 2018 (now U.S. Pat. No. 11,016,227), which claims priority under 35 U.S.C. § 119 to U.S. Provisional Application No. 62/559,982, filed on Sep. 18, 2017, the contents of which are incorporated herein by reference in their entireties.

TECHNICAL FIELD

The present disclosure relates to diffractive optical elements. More particularly, some aspects of the present disclosure relate to a diffractive optical element (DOE) that provides a particular phase delay between regions of the DOE.

BACKGROUND

A diffractive optical element (DOE) may be used for directing a beam. For example, a DOE, such as a diffractive lens, a spot array illuminator, a spot array generator, a beam splitter, a Fourier array generator, and/or the like, may be used to split a beam, shape a beam, focus a beam, and/or the like. A DOE may be integrated into a multicast switch, a wavelength selective switch, a gesture recognition system, a motion sensing system, and/or the like. A multi-level surface relief profile may be selected for a surface relief DOE. For example, a two-level (sometimes termed "binary") surface relief profile may be selected for the surface relief DOE. The two-level surface relief profile may be selected to approximate a continuous surface relief profile and to enable use of a photolithographic procedure and/or an etching procedure to manufacture the DOE. A period of the two-level surface relief profile may be sub-wavelength to approximate a continuous surface relief profile. A thin stack may be employed to form the two-level surface relief profile.

SUMMARY

According to some possible implementations, a diffractive optical element may include sub-wavelength period stack-and-gap structured layers providing transmissive phase delay at a wavelength. The sub-wavelength period stack-and-gap structured layers may include a set of thin anti-reflection layers that are index matched to an environment or a substrate over a range of fill factors of the sub-wavelength period.

According to some possible implementations, a diffractive optical element may include a stack of layers including a set of anti-reflection layers. The stack of layers may be transmissive for a wavelength. A width of the stack of layers may be divided into a set of periods. A width of each period, of the set of periods, may be shorter than the wavelength. A period, of the set of periods, may have a fill factor defining a width of a gap in the period. Fill factors of different periods may be different. A depth of the gap may extend through the stack of layers and through the set of anti-reflection layers. Each period, of the set of periods, may provide phase delay, at the wavelength, associated with a corresponding fill factor. Over a range of different fill factors, the set of anti-reflection layers may be index matched to an environment in the gap or to a substrate.

According to some possible implementations, a diffractive optical element may include stack-and-gap structured layers including at least one layer sandwiched between a first set of anti-reflection layers and a second set of anti-reflection layers. The stack-and-gap structured layers may provide transmissive phase delay at a wavelength. The stack-and-gap structured layers may have a period shorter than the wavelength. A material composition, a thickness, and a quantity of layers of the first set of anti-reflection layers and a material composition, a thickness, and a quantity of layers of the second set of anti-reflection layers may be selected such that, at the wavelength, a greater than 85% transmission efficiency is achieved over a range of fill factors of the period.

BRIEF DESCRIPTION OF THE DRAWINGS

FIGS. 3A-3G are diagrams of example implementations described herein; and

DETAILED DESCRIPTION

The following detailed description of example implementations refers to the accompanying drawings. The same reference numbers in different drawings may identify the same or similar elements.

A diffractive optical element (DOE) may be manufactured using a photolithographic procedure and/or an etching procedure. For example, to approximate a continuous surface relief profile, a multi-level surface relief profile may be selected for the DOE, and a surface of the DOE may be etched or patterned to form the multi-level surface relief profile. The multi-level surface relief profile may be used to create a phase delay for a beam passing through the DOE. However, a diffractive efficiency associated with the multi-level surface relief profile may be less than a threshold that is necessary for utilization of the DOE in an optical system, such as an optical communication system, a gesture recognition system, a motion detection system, and/or the like. Moreover, a transmittance of the multi-level surface relief profile may be less than a threshold that is necessary for utilization of the DOE in the optical system.

Some implementations, described herein, may provide a sub-wavelength period stack-and-gap structured DOE providing transmissive phase delay at a wavelength, thereby achieving polarization independence for a periodic grating based DOE. For example, some implementations, described herein, may provide a two-level (also termed "binary") DOE with a threshold transmittance for a threshold range of fill factors for the stack-and-gap structure of the DOE. Moreover, the DOE may be associated with a threshold diffractive efficiency, thereby enabling use in optical systems such as wavelength selective switches, spot array generators, and/or the like. In this way, a DOE may be formed with, for example, a single masking step and etching step, thereby improving manufacturability relative to multi-level fabrication techniques, variable dosage laser writing techniques, e-beam writing techniques, and/or the like. Furthermore, layers of the thin-film stack may be index-matched to a substrate of the DOE and/or an exit media. In this way, the thin stack improves transmittance relative to other techniques for manufacturing a DOE.

Figure 1:
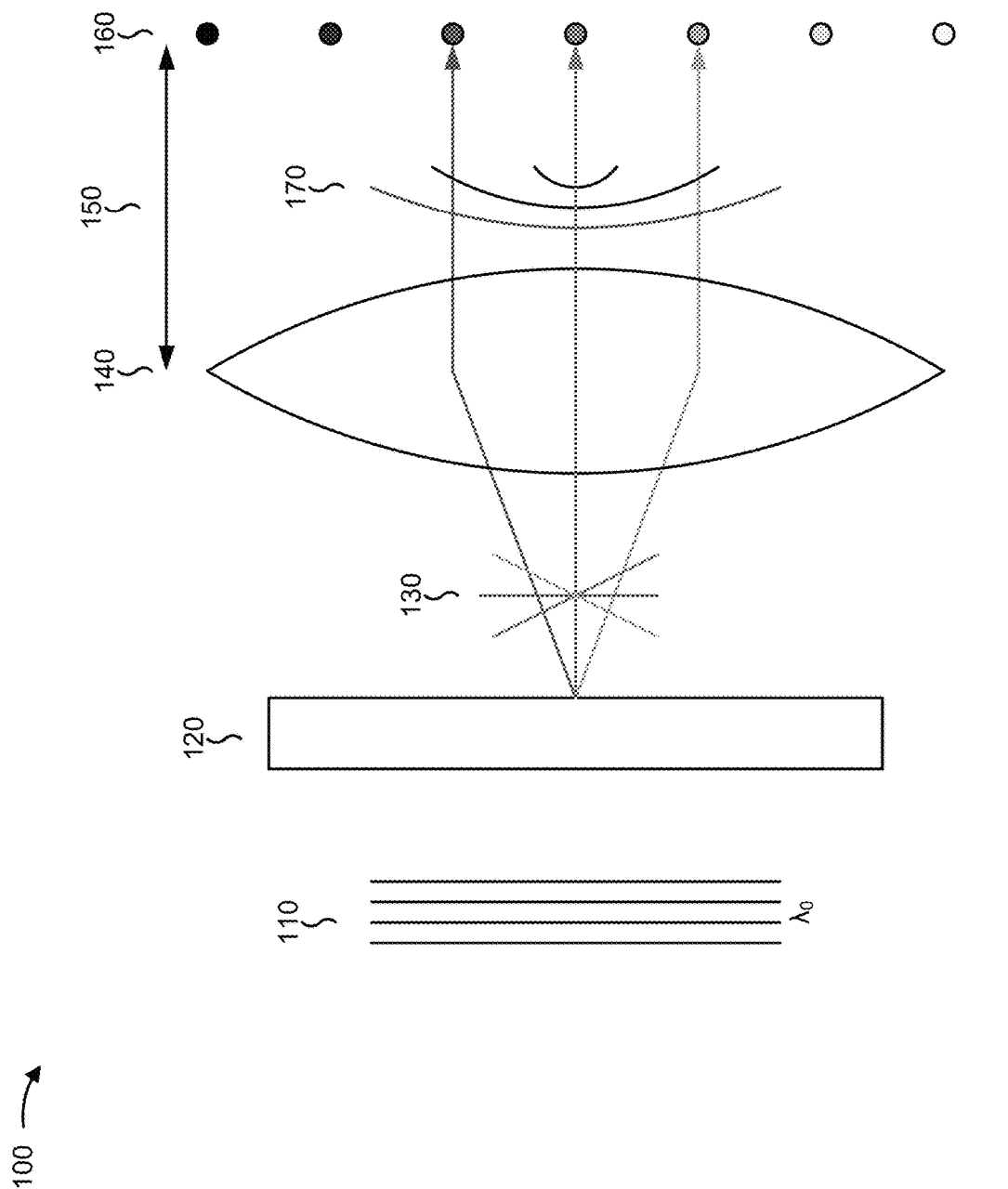
FIG. 1 is a diagram of an overview of an example implementation described herein.

FIG. 1 is a diagram of an overview of an example implementation 100 described herein. FIG. 1 shows an example of spot array generation using a DOE and a converging lens as a spot array illuminator (sometimes termed a spot array generator).

As shown in FIG. 1, an incident plane wave 110, with a wavelength of $\lambda_0$, is directed toward a DOE 120. In some implementations, DOE 120 may be a carrier grating with a varying fill factor, as described herein. For example, DOE 120 may be associated with a set of carrier periods, and each carrier period may include at least one stack and at least one gap. A size of the at least one stack and the at least one gap in each carrier period may correspond to a fill factor, and the fill factor may be configured to control a phase delay between carrier periods.

In some implementations, DOE 120 may include, for example, alternating silicon (Si) thin layers and silicon dioxide ($SiO_2$) thin layers, alternating hydrogenated silicon (Si:H) thin layers and silicon dioxide thin layers, and/or the like that are employed to form the stacks and gaps of the carrier grating. In some implementations, a size of a carrier period may be configured based on the wavelength of $\lambda_0$. For example, DOE 120 may be configured to be a sub-wavelength carrier grating with carrier periods associated with a width of less than the wavelength of $\lambda_0$. In some implementations, layers of DOE 120 may be configured to provide an anti-reflection functionality. For example, DOE 120 may include a single set of index-matched thin layers to provide the anti-reflection functionality, multiple sets of index-matched thin film layers to provide the anti-reflection functionality, and/or the like. In some implementations, a thin layer may be a layer with a thickness of less than a threshold as described herein, such as a thin film layer and/or the like. In some implementations, the anti-reflection functionality may be provided for a threshold range of fill factors, described herein.

In some implementations, incident plane wave 110 may have a wavelength in a range from approximately 700 nanometers (nm) to approximately 2000 nm, approximately 1000 nm to approximately 1800 nm, approximately 1400 nm to approximately 1600 nm, approximately 1500 nm to approximately 1600 nm, approximately 800 nm to 1000 nm, approximately 600 nm to 1000 nm, approximately 850 nm to 950 nm, and/or the like. Additionally, or alternatively, incident plane wave 110 may be associated with a center wavelength of approximately 1550 nm, which may be a wavelength at which DOE 120 provides a threshold phase delay, an anti-reflection functionality, and/or the like. In some implementations, a maximum transmissive phase delay provided by DOE 120 (e.g., between different carrier periods of DOE 120) may be greater than or equal to $\pi$, $2\pi$, $4\pi$, and/or the like. Additional details regarding DOE 120 are described herein.

As further shown in FIG. 1, DOE 120 diffracts incident plane wave 110, and directs wavefront 130 (e.g., diffracted orders of incident plane wave 110) toward a converging lens 140. Converging lens 140 is separated by a focal distance 150 from a focal plane 160. In some implementations, example implementation 100 may be used for a gesture recognition system, and focal plane 160 may be a target for gesture recognition. Additionally, or alternatively, focal plane 160 may be an object (e.g., for a motion sensing system), a communications target (e.g., for an optical communications system), and/or the like.

As further shown in FIG. 1, based on converging lens 140 altering an orientation of wavefront 130 to form wavefront 170, wavefront 170 is directed toward focal plane 160 causing a multiple spot array pattern to be formed at focal plane 160. In some implementations, DOE 120 may be used to create a one-dimensional spot array. In some implementations, DOE 120 may be used to create a two-dimensional spot array. In this way, a DOE may be used as a spot array illuminator to create a spot array at focal plane 160 from incident plane wave 110, thereby enabling a gesture recognition system, a motion sensing system, an optical communications system, and/or the like.

As indicated above, FIG. 1 is provided merely as an example. Other examples are possible and may differ from what was described with regard to FIG. 1.

Figure 2:
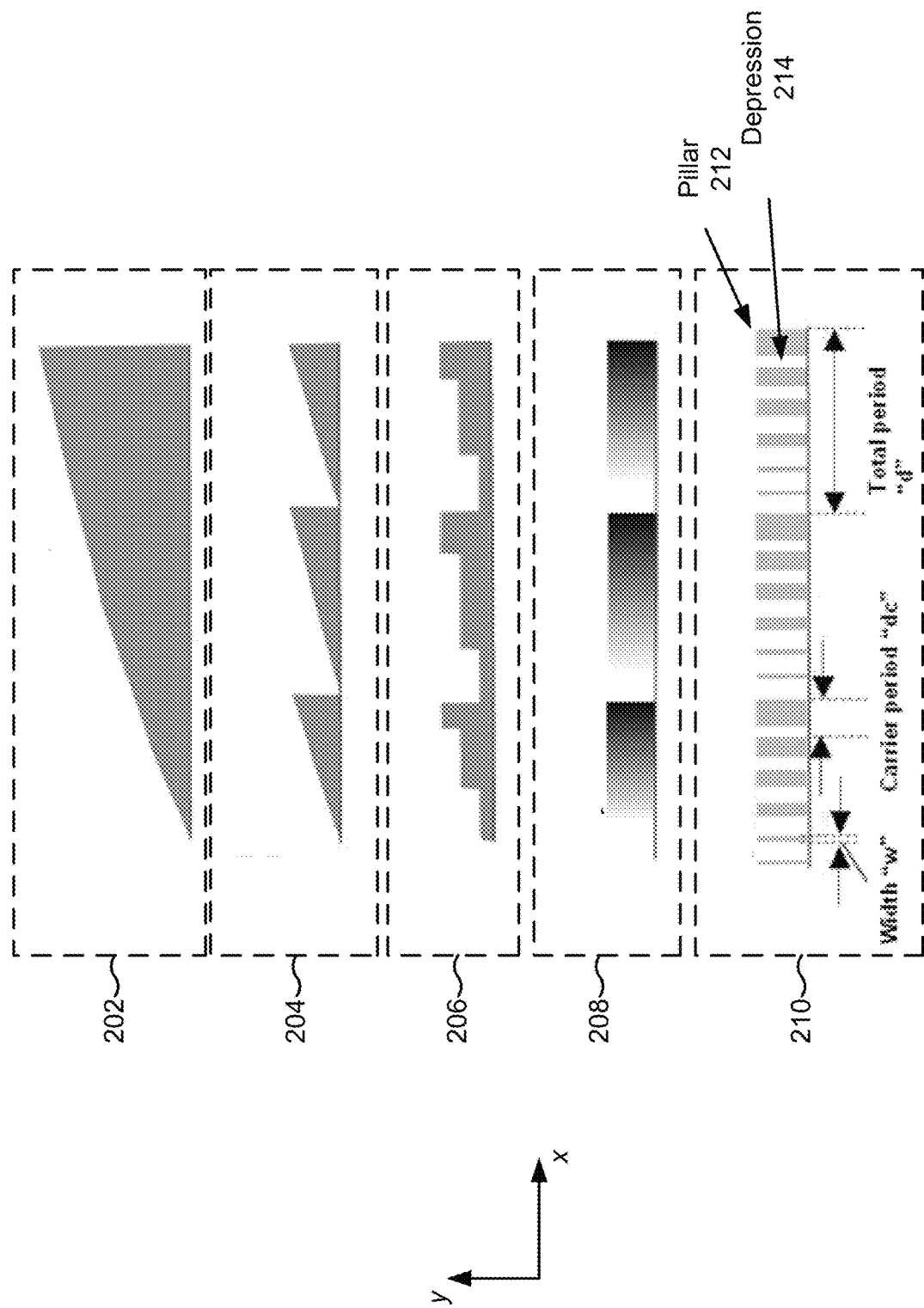
FIG. 2 is a diagram of characteristics relating to an example implementation described herein.

FIG. 2 is a set of diagrams 202-210 of characteristics relating to a set of DOEs. As shown in FIG. 2, and by diagrams 202-210, the set of DOEs may be associated with different relief profiles for refractive lenses of the set of DOEs.

As further shown in FIG. 2, and by diagram 202, a first DOE may be associated with a continuous phase relief profile for a refractive optical element (e.g., a lens). The first DOE may provide a continuous experienced phase delay from 0 to a maximum phase delay across a surface of the first DOE. Although described herein as a 0 phase delay, the 0 phase delay may be a minimum phase delay. In other words, the 0 phase delay may be a 0 relative phase delay, and the maximum phase delay may be a maximum relative phase delay (relative to the 0 phase delay). As further shown by diagram 204, a second DOE may be associated with a modulus $2\pi$ Fresnel zone continuous phase diffractive optic. The second DOE may provide a periodic continuous phase delay from 0 to a maximum phase delay across a surface of the second DOE. For example, the second DOE may include a first region with an experienced phase delay of 0 to the maximum phase delay, a second region with an experienced phase delay of 0 to the maximum phase delay, and a third region with an experienced phase delay of 0 to the maximum phase delay.

As further shown in FIG. 2, and by diagram 206, a third DOE may be associated with a periodic n-level (e.g., two or more level) relief profile. For example, the third DOE may include a plurality of discrete levels, each associated with a different experienced phase delay from 0 to a maximum phase delay. In this case, the third DOE includes a first region with a first level with a first phase delay of 0, a second level with a second phase delay between 0 and a maximum phase delay, and a third level with a third phase delay of the maximum phase delay; a second region with the first level, second level, and third level; and a third region with the first level, second level, and third level. As further shown by diagram 208, a fourth DOE may be associated with a periodic graded index phased array liquid crystal on substrate (LCOS) optical element. For example, the fourth DOE may provide a set of different phase delays in each region of the LCOS optical element.

As further shown in FIG. 2, and by diagram 210, a fifth DOE may be a sub-wavelength periodic binary grating. For example, the fifth DOE may include a binary (two-level) structure with differing fill factors for stacks 212 or gaps 214 of the fifth DOE. Based on using a two-level grating structure for stacks 212 or gaps 214, the fifth DOE may be associated with reduced manufacturing time and/or cost, improved diffractive efficiency, and/or improved transmittance relative to the first DOE, the second DOE, the third DOE, and/or the fourth DOE. In some implementations, a carrier period (also termed a pitch), dc, with regard to an x direction and ay direction, may be less than a wavelength of incident light, and may be termed sub-wavelength. In this case, based on the carrier period being sub-wavelength, a local effective refractive index, $n_{\mathit{eff}}$, is caused for incident light.

In some implementations, a value for the local refractive index is varied across a total period, d, of the fifth DOE. For example, based on a variable fill factor across a total period (e.g., a first carrier period, of the total period, having a first fill factor and a second carrier period, of the total period, having a second fill factor), the local effective refractive index may be varied across the total period. A fill factor may represent a ratio of a width, w, of a stack 212 relative to a width of a carrier period in which the stack 212 is located. Similarly, the fill factor may be related to a ratio of a width of a space between a set of stacks 212, which may be termed a gap 214, relative to the width of the carrier period in which the gap 214 is located. Based on varying the fill factor across the total period, the fifth DOE may be associated with a varying local effective refractive index across the total period, and may form a two-level DOE structure, also termed a binary DOE structure, which may be index matched to an environment or to a substrate over a range of fill factors of a carrier period. In some implementations, another type of multi-level DOE structure may be formed using a carrier grating, such as a three-level DOE, a four-level DOE, or another type of n-level DOE (n≥2). In some implementations, a total period of a DOE may be varied with regard to multiple axes (e.g., with regard to an x direction and a y direction). For example, a two dimensionally varying DOE may be used for a diffractive lens or another use case.

As indicated above, FIG. 2 is provided merely as an example. Other examples are possible and may differ from what was described with regard to FIG. 2.

Figure 3A:
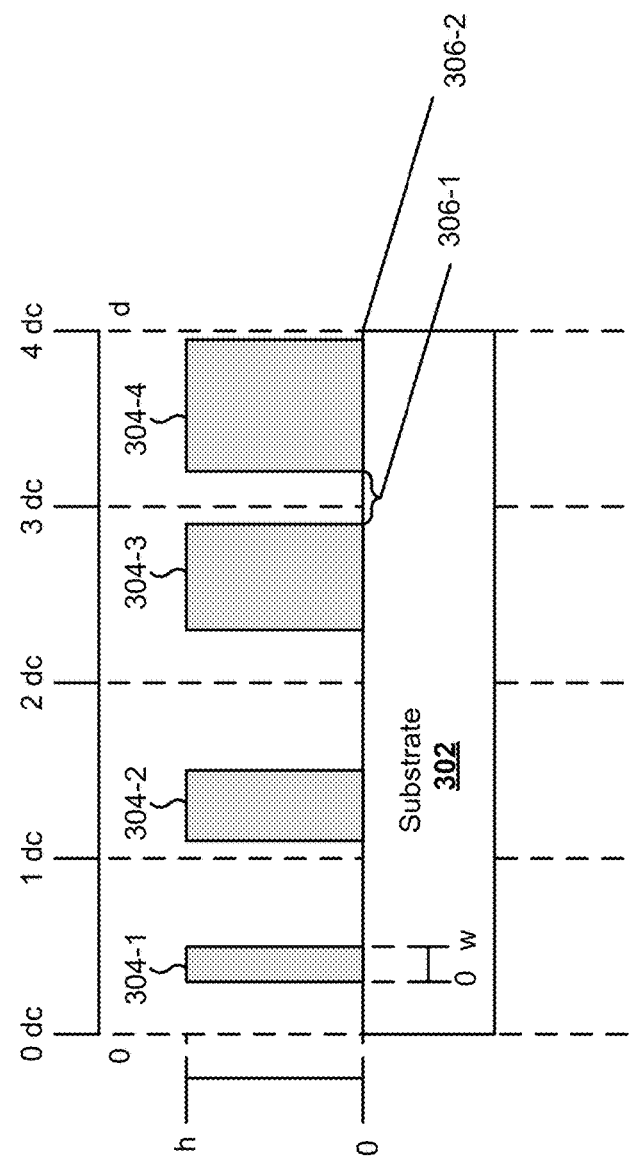

FIGS. 3A-3G are diagrams of example implementations of DOEs. FIG. 3A shows a cross-sectional view of an example DOE 300.

As shown in FIG. 3A, DOE 300 may include a substrate 302. In some implementations, substrate 302 may be a glass substrate, a fused silica substrate, a borosilicate glass substrate, and/or the like. For example, substrate 302 may be a fused silica substrate with a thickness in a range from approximately 200 micrometers to approximate 3 millimeters, or of approximately 725 micrometers, and with a refractive index, $n_{sub}$, of approximately 1.45. In some implementations, substrate 302 may be associated with a total period, d, and each period may be defined, with respect to a particular dimension of substrate 302 by a set of carrier periods, dc. For example, substrate 302 may include, extending planar with a top surface of substrate 302, a first carrier period from 0 dc to 1 dc, a second carrier period from 1 dc to 2 dc, a third carrier period from 2 dc to 3 dc, and a fourth carrier period from 3 dc to 4 dc. In some implementations, each carrier period may be associated with at least one stack, and may be a sub-wavelength period. For example, the first carrier period may include stack 304-1, the second carrier period may include stack 304-2, the third carrier period may include stack 304-3, and the fourth carrier period may include stack 304-4. Similarly, each carrier period may be associated with at least one gap. For example, the fourth carrier period may be associated with a portion of gap 306-1 (another portion of gap 306-1 may be included in the third carrier period) and a portion of gap 306-2 (another portion of gap 306-2 may be included in another carrier period of another total period of DOE 300 on substrate 302). In this case, stacks 304 and gaps 306 are castellated in a single dimension planar to a surface of substrate 302.

In some implementations, each stack 304 may be associated with a particular height, h, above a surface of each gap 306 and/or above a surface of substrate 302. For example, each stack 304 may be associated with a height in a range from approximately 0.5 micrometers to approximately 6 micrometers (e.g., a 4 π period at 940 nanometers using silicon and a 2 π period at 1550 nanometers using fused silica), or of approximately 1.2 micrometers (e.g., a 4 π period at 1550 nanometers using silicon). In some implementations, a first stack 304 may be associated with a different height than a second stack 304. For example, stacks 304 of a common carrier period, of different carrier periods, and/or the like may be associated with different heights above a top surface of substrate 302. In some implementations, each gap 306 may be associated with a common depth from a top surface of stacks 304. Additionally, or alternatively, a first gap 306 may be associated with a first depth from a surface of a stack 304 and a second gap 306 may be associated with a second depth from a surface of a stack 304. Collectively, a stack 304 and a gap 306 may form a stack-and-gap structure.

In some implementations, each carrier period may be associated with a fill factor. The fill factor in one dimension and two dimensions, respectively may be calculated based on equations:

$$\mathrm{ff} = w/dc \tag{1}$$

where ff represents the fill factor, w represents a width of a stack 304 within a particular carrier period in one dimension or an area in two dimensions, and dc represents a width of the particular carrier period in one dimension or an area in two dimensions. In some implementations, when a carrier period includes multiple stacks 304, w may represent a sum of widths of the multiple stacks 304 in the carrier period, an average of widths of the multiple stacks 304 in the carrier period, and/or the like. In some implementations, the fill factor may vary with regard to carrier periods, of a total period, arranged along a dimension planar with a top surface of substrate 302, such that thin anti-reflection layers form stacks 304 and gaps 306 are index matched to an environment or to a substrate over a range of fill factors (e.g., over the first through fourth fill factors as described below). For example, the first carrier period may be associated with a first fill factor, the second carrier period may be associated with a second fill factor, the third carrier period may be associated with a third fill factor, and the fourth carrier period may be associated with a fourth fill factor.

In some implementations, each carrier period of a total period may be associated with a different fill factor. In some implementations, two or more carrier periods of the total period may be associated with a common fill factor and another two or more carrier periods of the total period may be associated with a different fill factor. In some implementations, each carrier period of multiple total periods may be associated with a range of different fill factors. In some implementations, at least one carrier period of a first total period and at least one carrier period of a second total period may be associated with a common fill factor. In some implementations, multiple total periods may be associated with a common average fill factor, a different average fill factor, and/or the like. In some implementations, each carrier period may be associated with a common fill factor. For example, when DOE 300 includes carrier periods defined across two dimensions planar with a top surface of substrate 302 (e.g., and stacks extend in a third dimension perpendicular to the top surface of substrate 302, as shown), carrier periods linearly arranged with regard to a first of the two dimensions may be associated with a common fill factor and carrier periods linearly arranged with regard to a second of the two dimensions may be associated with different fill factors.

As shown in FIG. 3B, in a top-down view, another example implementation of a DOE, DOE 320, may include total periods with carrier periods arranged in two dimensions extending planar with a top surface of a substrate 322. In this case, the stacks and gaps are castellated in two dimensions planar to a surface of DOE 320.

As further shown in FIG. 3B, DOE 320 may include, in a first dimension, x, at least one total period, $d_x$, and a set of carrier periods $dc_x$. Similarly, in a second dimension, y, DOE 320 may include at least one total period, $d_y$, and a set of carrier periods, $dc_y$. In this way, a carrier grating of DOE 320 (e.g., stacks and gaps of DOE 320) may provide a two-dimensional polarization independent DOE. For example, DOE 320 includes carrier periods 324-1-1, 324-2-1, 324-3-1, and 324-4-1 aligned linearly in the first dimension. Similarly, DOE 320 includes carrier periods 324-1-1, 324-1-2, 324-1-3, and 324-1-4 aligned linearly in the second dimension. In this case, carrier periods aligned in the second dimension are each associated with a common fill factor, and carrier periods aligned in the first dimension are each associated with a different fill factor. For example, stacks 326-1-1 and 326-1-2 are associated with a common width, resulting in a common fill factor, and stacks 326-1-1 and 326-2-1 are associated with different widths, resulting in a range of different fill factors. In some implementations, a pattern or arrangement of stacks and gaps in the carrier period may be selected based on a particular design technique. For example, a two-dimensional rigorous grating theory technique, a thin film theory technique, a simulated annealing and steepest descent technique, and/or the like may be used to identify a pattern or arrangement of gaps and stacks to provide a particular phase delay at a particular wavelength for which stacks and gaps provide an anti-reflection functionality.

Figure 3C:
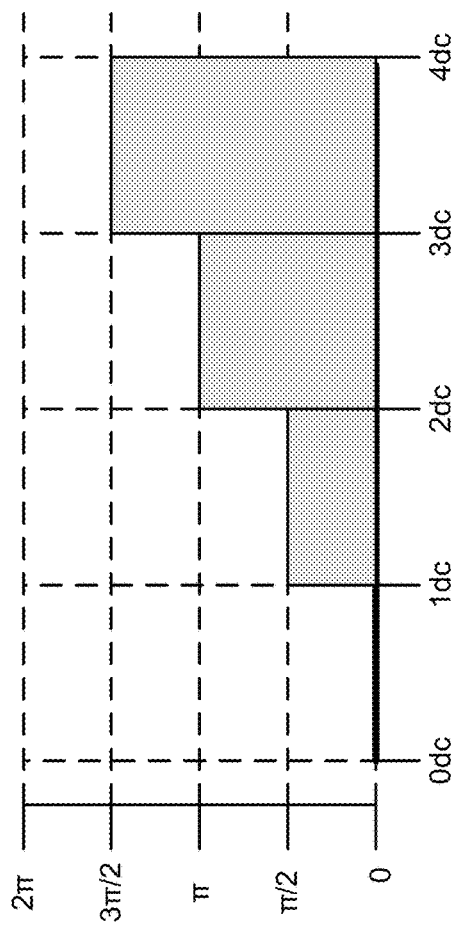

As shown in FIG. 3C, and by diagram 340, an example phase profile of phase delays is provided for carrier periods of a DOE described herein, such as for DOE 300 and/or for DOE 320 with respect to the first (x) dimension. For example, for the first carrier period, a (relative) phase delay of 0 is caused by at least one stack and/or at least one gap of the first carrier period. Similarly, for the second carrier period, a phase delay of $\pi/2$ is caused; for the third carrier period, a phase delay of $\pi$ is caused; and for the fourth carrier period, a phase delay of $3\pi/2$ is caused.

In some implementations, the phase delay of a DOE described herein may be configured for a particular spectral range. For example, the phase delay may be configured for a spectral range at which the stacks and gaps provide an anti-reflection functionality, such as a spectral range with a center illumination wavelength of 1550 nanometers. In this case, a width of a grating formed by the stacks and gaps may be less than 1550 nanometers.

Although described herein in terms of a particular set of phase delays, other phase delays are possible, such as other equally spaced phase delays (e.g., 0, $\pi/4$, $\pi/2$, $3\pi/4$, $\pi$), other non-equally spaced phase delays (e.g., 0, $\pi$, $3\pi/2$, $7\eta/8$), a combination of equally spaced phase delays and non-equally spaced phase delays, and/or the like.

Figure 3D:
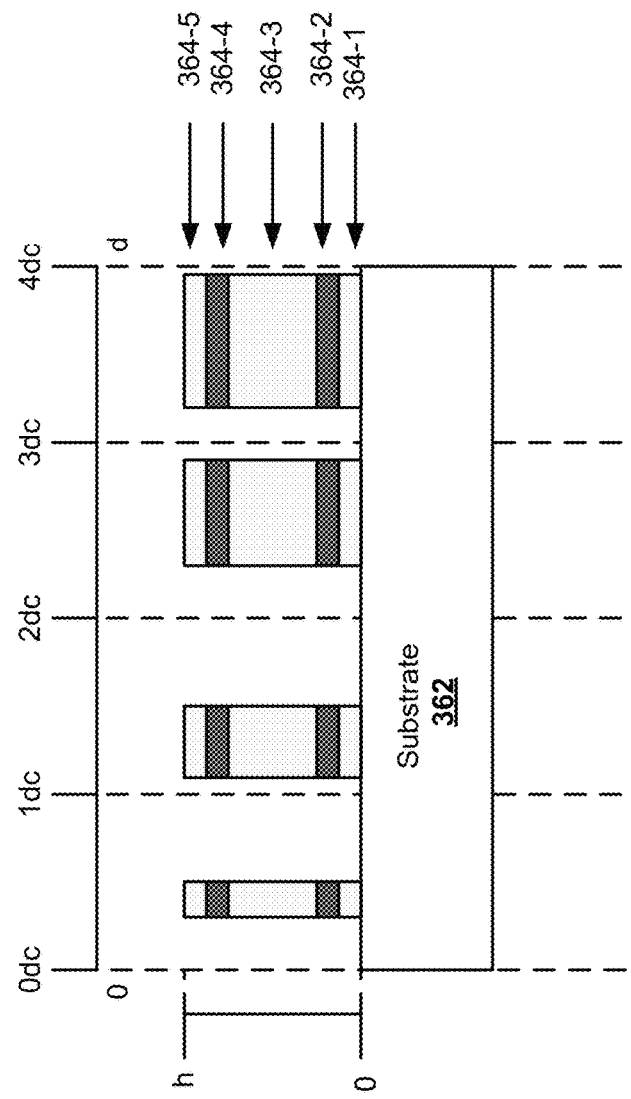

As shown in FIG. 3D, another example implementation of a DOE, DOE 360, may include multiple thin layers (e.g., thin film layers). For example, stacks of DOE 360 may be manufactured from multiple layers of thin films on a surface of substrate 362. In this case, a stack may include a first layer 364-1 of silicon, a second layer 364-2 of silicon dioxide, a third layer 364-3 of silicon, a fourth layer 364-4 of silicon dioxide, and a fifth layer 364-5 of silicon. In some implementations, layers 364-1 and 364-2 may form an index-matched pair. Similarly, layers 364-4 and 364-5 may form an index-matched pair. In contrast, layer 364-3 may be a spacer between the index-matched pairs that may be selected to control an effective index of DOE 360.

In some implementations, layers 364 may be index-matched to substrate 362, an air interface with layers 364, and/or the like. In this way, transmittance may be improved relative to other techniques for forming a diffractive optical element. Moreover, based on a diffractive index of DOE 360 varying based on a fill factor of carrier periods of DOE 360, DOE 360 may be index-matched with reduced manufacturing difficulty relative to index matching based only on material selection. In some implementations, layers 364 may be deposited using a deposition technique. For example, layers 364 may be deposited using thin film deposition (e.g., sputter deposition and/or the like). In some implementations, stacks may be formed from layers 364 using a masking and etching technique.

In some implementations, layers 364-1 through 364-5 may be associated with a set of thicknesses. For example, DOE 360 may be associated with a thickness of 53 nanometers for layer 364-1, 64 nanometers for layer 364-2, 1000 nanometers for layer 364-3, 121 nanometers for layer 364-4, and 28 nanometers for layer 364-5. In this case, layer 364-3, which may be a spacer layer between the index-matched pairs, provides a phase delay that may be tuned by adjusting the fill factor of stacks and gaps formed using layers 364. In some implementations, layer 364-3 may be associated with a refractive index satisfying a threshold, such as a refractive index greater than 2.0, a refractive index of approximately 3.5, and/or the like. In some implementations, a spacer layer between index-matched pairs, such as layer 364-3, may be omitted. For example, one or more index-matched pairs of thin film layers may be formed on substrate 362 consecutively and etched to form stacks without a spacer layer, such as layer 364-3.

Although described herein in terms of a particular set of thicknesses, other thicknesses are possible to achieve an anti-reflection functionality, a particular phase delay, a particular refractive index, and/or the like. In some implementations, layers 364 of a stack may be formed using a deposition procedure. For example, a silicon thin film layer, a silicon dioxide thin film layer, and/or the like may be deposited onto a surface of substrate 362 to form a set of anti-reflection layers that are configured as a set of stacks and a set of gaps. Additionally, or alternatively, the stacks and the gaps may be formed using an etching procedure. For example, after deposition of silicon, silicon dioxide, and/or the like to form thin film layers on substrate 362, the layers may be masked using a single masking step and etched using a single etching step to form gaps and stacks.

Figure 3E:
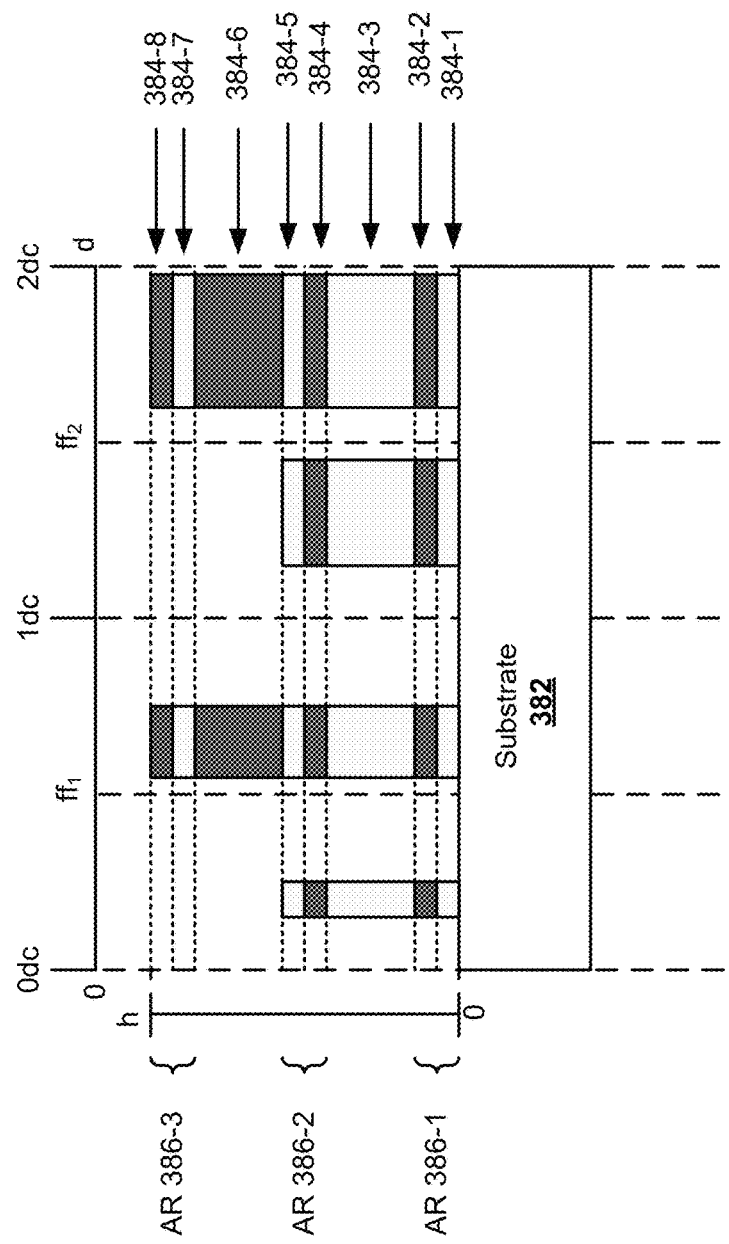

As shown in FIG. 3E, another example of a DOE 380 may include a variable fill factor and a three or more level relief pattern. For example, stacks of DOE 380 may include multiple layers of thin films on a surface of substrate 382 to form a multi-level DOE with varying fill factors. In this case, a stack may include a first layer 384-1 of silicon, a second layer 384-2 of silicon dioxide, a third layer 384-3 of silicon, a fourth layer 384-4 of silicon dioxide, and a fifth layer 384-5 of silicon, a sixth layer 384-6 of silicon dioxide, a seventh layer 384-7 of silicon, and an eighth layer 384-8 of silicon dioxide. In some implementations, layers 384-1 and 384-2 may form a first index-matched pair, layers 384-4 and 384-5 may form a second index-matched pair, and layers 384-7 and 384-8 may form a third index-matched pair. Further, layers 384-1 and 384-2 may be a first anti-reflection structure 386-1, layers 384-4 and 384-5 may form a second anti-reflection structure 386-2, and layers 384-7 and 384-8 may form a third anti-reflection structure 386-3. In contrast, layers 384-3 and 384-6 may be spacers between index-matched pairs that may be selected to control an effective refractive index of DOE 380.

In another example, a metal layer may be used as a layer of DOE 380. For example, rather than forming layers 384-1 and 384-2 onto a top surface of substrate 382, a metal layer may be used to replace anti-reflection structure 386-1 and substrate 382, and layer 384-3 may be formed onto a top surface of the metal layer.

In DOE 380, each carrier period includes multiple stacks and multiple gaps to configure a fill factor of each carrier period. For example, a first carrier period from 0 dc to 1 dc includes a first stack with a first height (e.g., layers 384-1 to 384-5) and width and a second stack with a second height (e.g., layers 384-1 to 384-8) and width to form a first fill factor $ff_1$. In contrast, a second carrier period from 1 dc to 2 dc includes a third stack with the first height (e.g., layers 384-1 to 384-5) and another width and a fourth stack with the second height (e.g., layers 384-1 to 384-8) and another width to form a second fill factor $ff_2$. In this case, each of the first to fourth stacks is associated with a different width to form the first fill factor and the second fill factor.

In another example, a carrier period may include multiple gaps associated with different depths from a top surface of a thin film layer towards a top surface of a substrate. In some implementations, DOE 380 may be formed onto a wafer, such as a vertical-cavity surface-emitting laser (VCSEL). For example, DOE 380 may be formed onto a wafer including one or more emitters oriented to emit through substrate 382 and toward the top surface of substrate 382. Additionally, or alternatively, DOE 380 may be formed onto a wafer including another optical element, such as a vertical emitter array, a sensor, a sensor array, and/or the like.

Figure 3F:
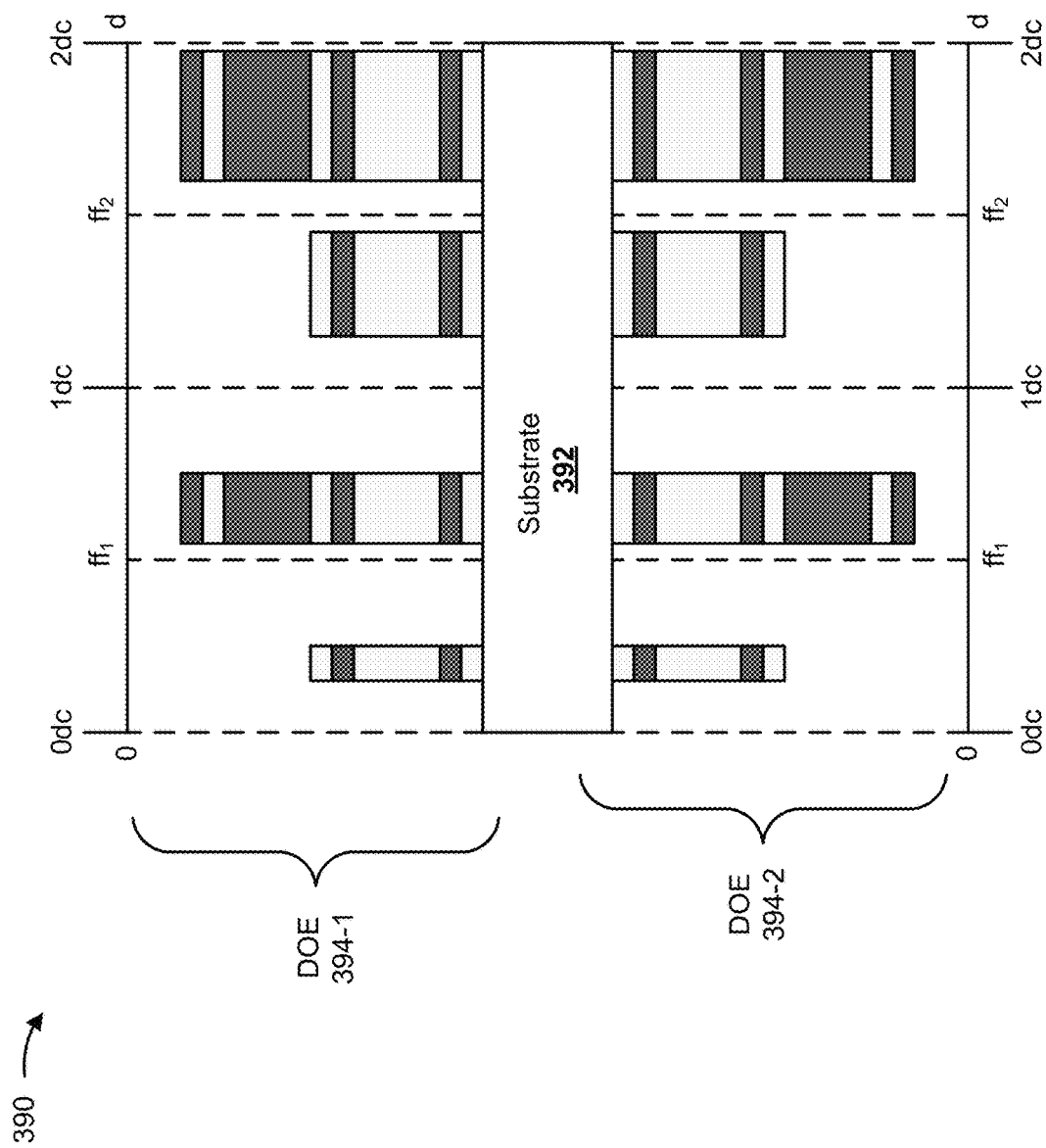

As shown in FIG. 3F, another example implementation of an optical element 390 may include a substrate 392 with a first DOE 394-1 on a first, top surface of substrate 392 and a second DOE 394-2 on a second, bottom surface of substrate 392. For example, thin film layers may be deposited and/or formed on the top surface and the bottom surface of substrate 392 to form a set of DOEs 394. In this way, a difficulty in aligning multiple DOEs may be reduced relative to mounting multiple DOEs on multiple substrates and aligning the multiple substrates. In some implementations, corresponding carrier periods of DOEs 394-1 and 394-2 may be associated with common fill factors. For example, both DOE 394-1 and DOE 394-2 may be associated with a first fill factor, $ff_1$, for a first carrier period from 0 dc to 1 dc, and may be associated with a second fill factor, $ff_2$, for a second carrier period from 1 dc to 2 dc. Additionally, or alternatively, corresponding carrier periods of DOEs 394-1 and 394-2 may be associated with different fill factors.

Figure 3G:
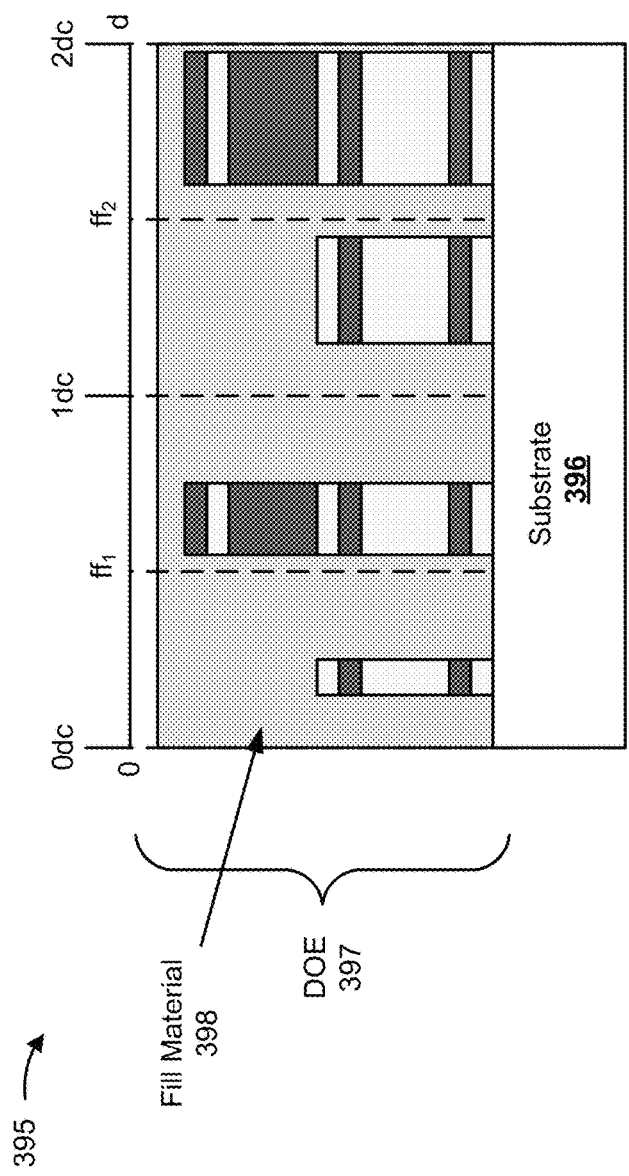

As shown in FIG. 3G, another example implementation of an optical element 395 may include a substrate 396 with a DOE 397 and a fill material 398. In this case, fill material 398 may be disposed into gaps between stacks and/or onto a surface of the stacks and/or substrate 396 to create a planar surface for optical element 395. In this way, fill material 398 may seal optical element 395 to prevent degradation of optical performance resulting from a presence of water, humidity, and/or the like. In some implementations, fill material 398 may be associated with a particular refractive index matched to the stacks, such as a refractive index of approximately 1.6 to create a 1.9 differential with stacks with a refractive index of approximately 3.5. In this way, a phase delay is maintained when optical element 395 is in contact with, for example, water.

Although described herein in terms of a set of 5 layers, 8 layers, and/or the like, other quantities of layers are possible, such as additional layers, fewer layers, or a different combination of layers.

As indicated above, FIGS. 3A-3G are provided merely as examples. Other examples are possible and may differ from what was described with regard to FIGS. 3A-3G.

FIGS. 4A-4D are diagrams 400-460 of example characteristics of a DOE.

Figure 4A:
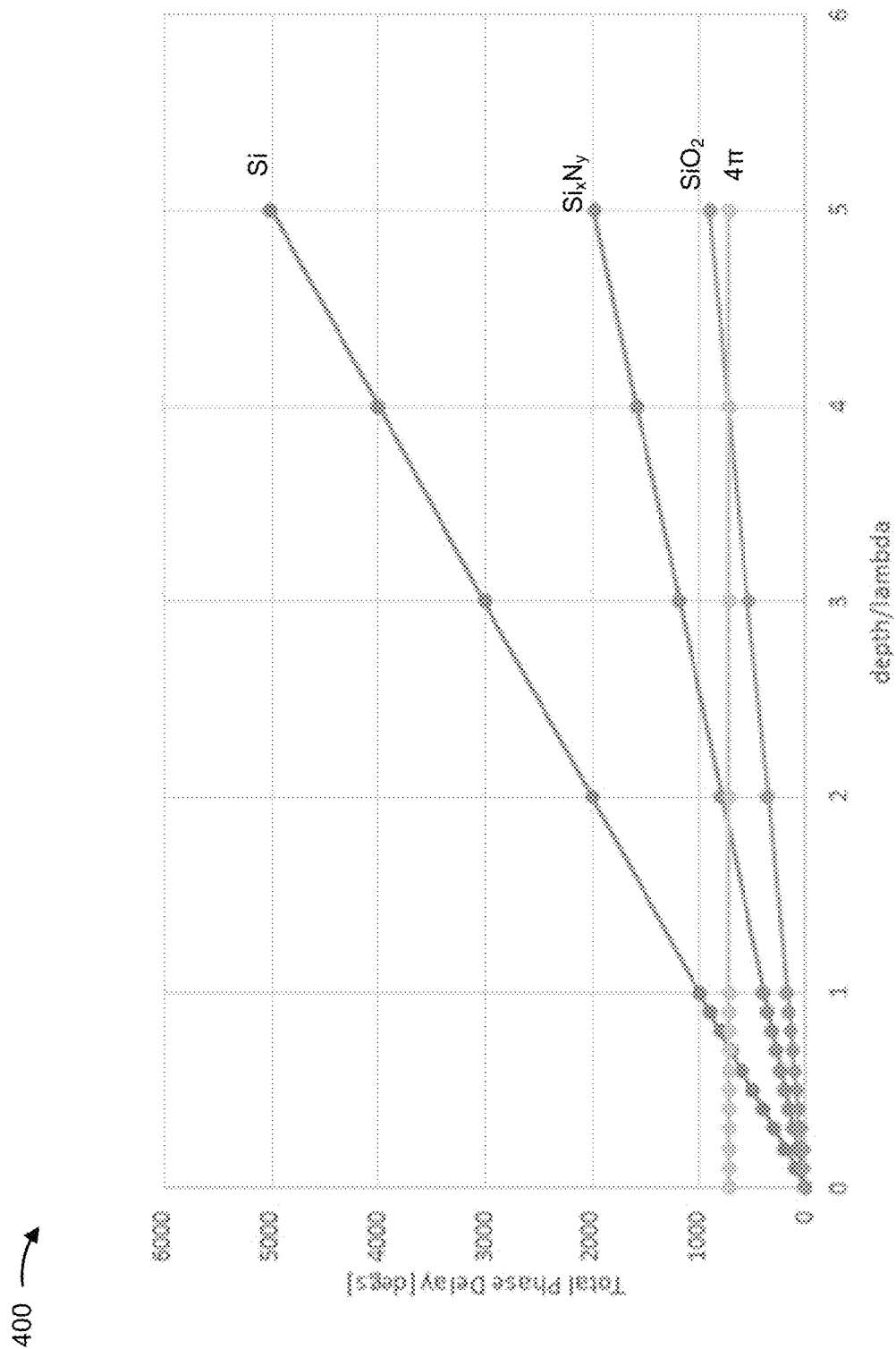
FIGS. 4A-4D are diagrams of characteristics relating to an example implementation described herein.

As shown in FIG. 4A, diagram 400 shows a maximum available phase delay as a function of a grating thickness (e.g., a height of a stack or a depth of gap). In some implementations, a $4\pi$ maximum phase delay may be selected for a DOE based on manufacturability criterion. Some optical systems may require a threshold experienced phase delay between regions of a DOE (e.g., between carrier periods), which may be configured based on a fill factor of a DOE, of 0 to $2\pi$. Deep reactive ion etching (DRIE) techniques may be used for an aspect ratio, which may be defined as a ratio of a depth to a minimum feature size, of greater than 10 and deep-ultra-violet (DUV) stepper and scanner techniques can be used to achieve features of greater than 100 nanometers. Thus, a grating thickness of approximately 1 micrometer for the stacks may be achieved using DRIE techniques and DUV stepper and scanner techniques, in some implementations. In this case, a DOE may be configured with a $4\pi$ maximum phase delay (for a fill factor of 100% relative to a fill factor of 0%), which may enable the DOE to achieve a $2\pi$ maximum phase delay (for a fill factor of 75% relative to a fill factor of 25%) using a 1 micrometer etch.

As further shown in FIG. 4A, and by diagram 400, a DOE may be manufactured using silicon (Si) with a refractive index of 3.5, a silicon-nitrogen material ($Si_xN_y$) (e.g. silicon nitride) with a refractive index of 2.0, a silicon dioxide ($SiO_2$) material with a refractive index of 1.5, and/or the like. As shown in diagram 400, silicon may be selected as a material for etching to manufacture stacks of a DOE. In this case, silicon may enable a reduced thin layer (e.g., thin film) thickness relative to other materials, thereby improving manufacturability. For example, for silicon dioxide, a thin film layer thickness of 4 micrometers, which may correspond to an aspect ratio of 40, may be required to achieve a maximum phase delay of 720 degrees ($4\pi$). For silicon nitride, a thin film layer thickness of 2 micrometers, which may correspond to an aspect ratio of 20, may be required to achieve a maximum phase delay of 720 degrees. For silicon, a thin film layer thickness of 0.7 micrometers, which may correspond to an aspect ratio of 7, may be required to achieve a maximum phase delay of 720 degrees. In this way, selection of silicon for thin film layers reduces a maximum required thin film layer thickness and an aspect ratio relative to other materials, thereby enabling improved manufacturability for the DOE. In some implementations, silicon and silicon dioxide may be selected as thin film layers for the DOE, and a thin film layer may act as an integrated etch stop for etching the DOE to form a multi-level relief profile for stacks of the DOE. In some implementations, a fill material may be deposited onto the thin layers after etching to fill gaps between etched stacks, thereby providing an index-matched material for the thin film layers to avoid degradation to phase delay performance relating to a non-index-matched material coming in contact with the etched stacks, such as water.

Figure 4B:
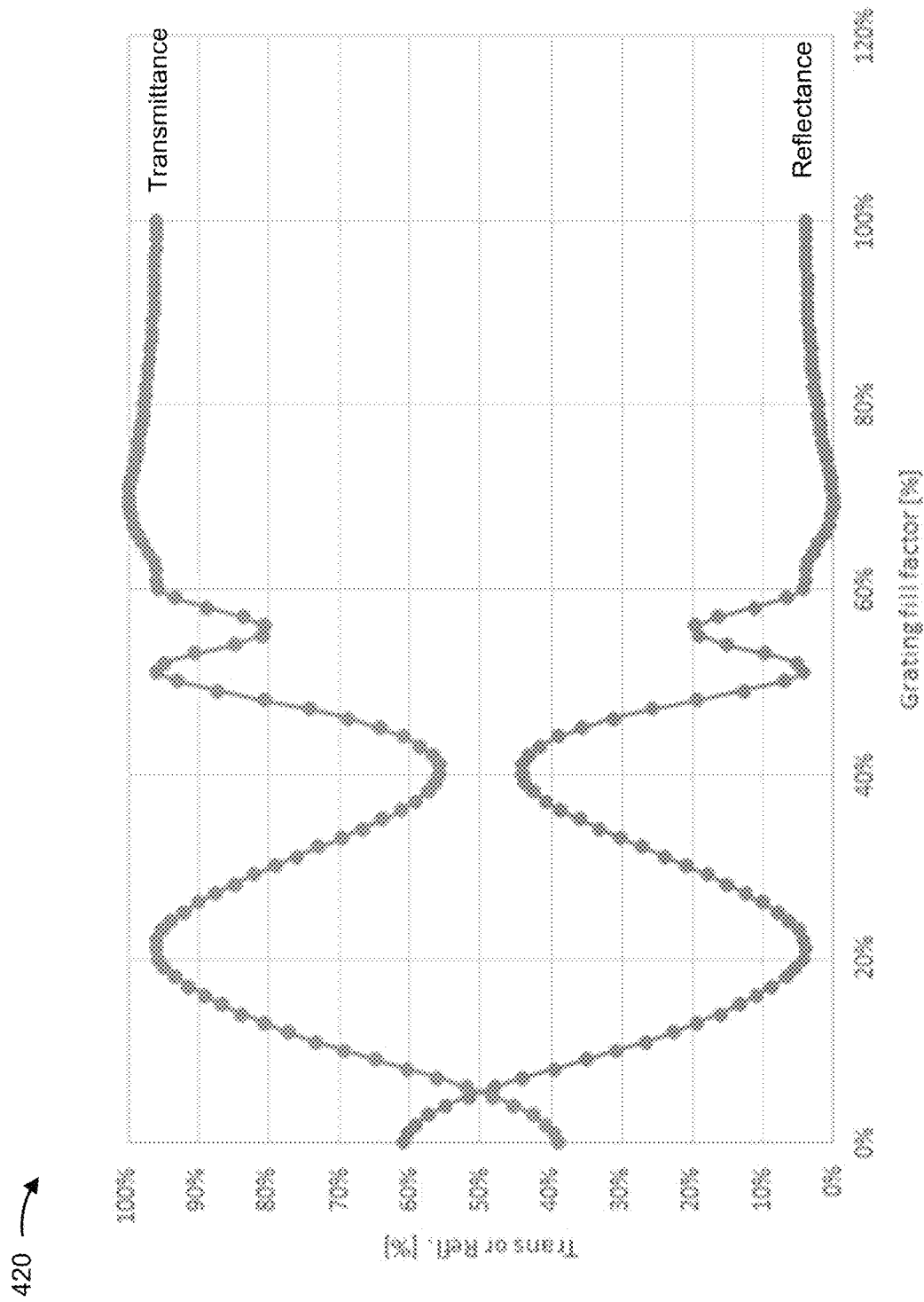

As shown in FIG. 4B, and by diagram 420, a transmittance and a reflectance may be determined for a DOE based on a fill factor of the DOE. In this case, the DOE may be a non-index-matched two-dimensional sub-wavelength periodic carrier grating with a silicon thin film stack. As shown in diagram 420, for the non-index-matched DOE, transmittance may be less than a threshold, such as less than 50%, less than 60%, less than 70%, less than 80%, less than 90%, less than 95%, less than 99%, and/or the like for differing grating fill factors. For example, average transmittance may be 83% across the fill factors. Similarly, reflectance may be greater than a threshold, such as greater than 60%, greater than 50%, greater than 40%, greater than 30%, greater than 20%, greater than 10%, greater than 5%, greater than 1%, and/or the like.

Figure 4C:
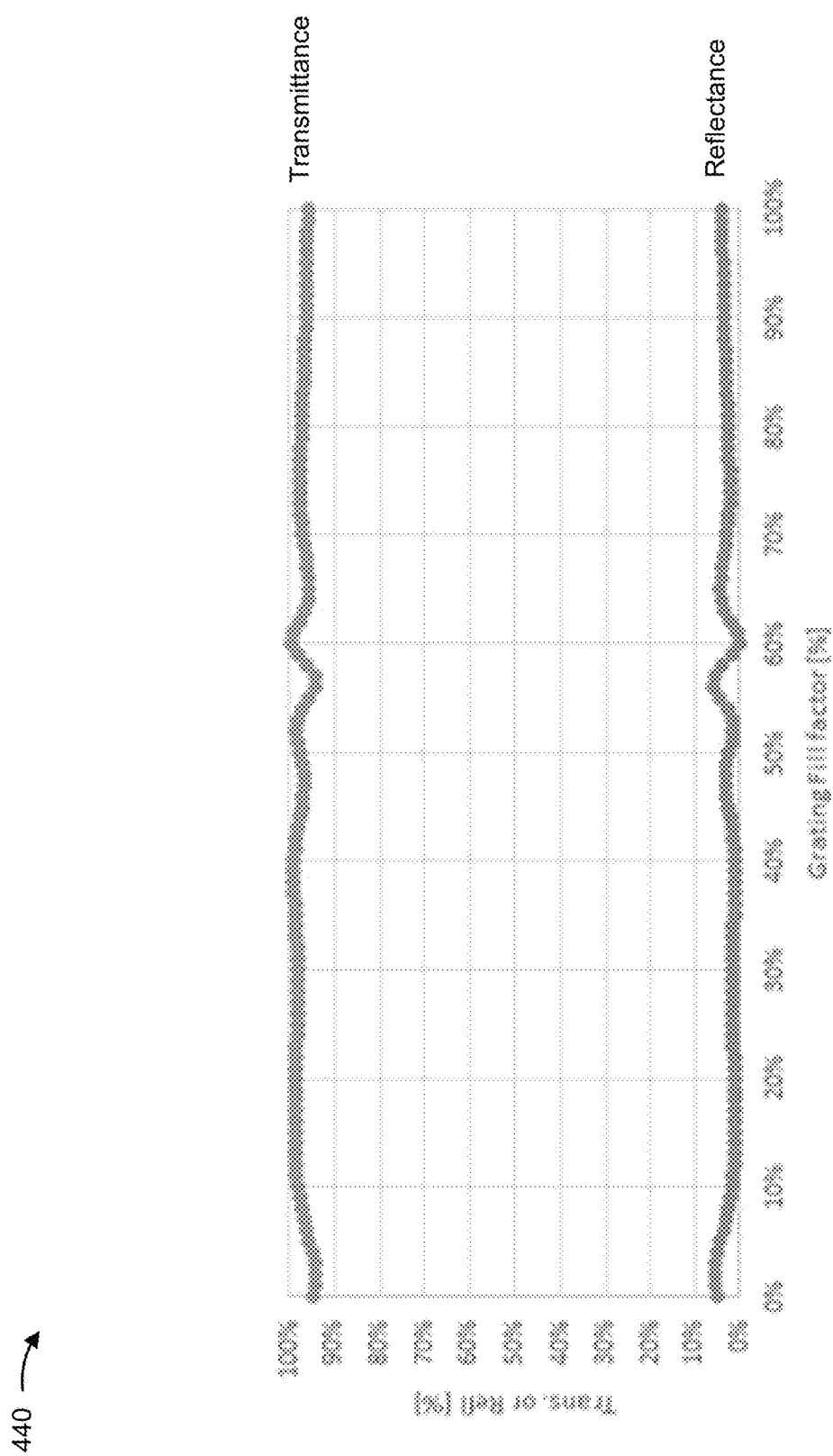

As shown in FIG. 4C, and by diagram 440, a transmittance and a reflectance may be determined for another DOE based on a fill factor of the other DOE. In this case, the other DOE is an index-matched two-dimensional sub-wavelength periodic carrier grating with a silicon and silicon dioxide thin film layers forming stacks. As further shown in diagram 440 for the index-matched DOE, transmittance may be greater than a threshold, such as greater than 90%, greater than 95%, greater than 99%, and/or the like for a range of fill factors from 0% to 100% and/or a subrange thereof. For example, average transmittance may be 97.4% across the range of fill factors. Similarly, reflectance may be less than a threshold, such as less than 10%, less than 5%, less than 1%, and/or the like for a range of fill factors from 0% to 100% and/or a subrange thereof. As a result, based on configuring a material composition, a thickness, and a quantity of layers a transmission efficiency of greater than 85%, greater than 95%, greater than 99%, and/or the like may be achieved over a range of fill factors. In this way, index matching thin film layers of a DOE may result in improved transmittance and reduced reflectance, thereby improving optical performance relative to other techniques for manufacturing a DOE.

Figure 4D:
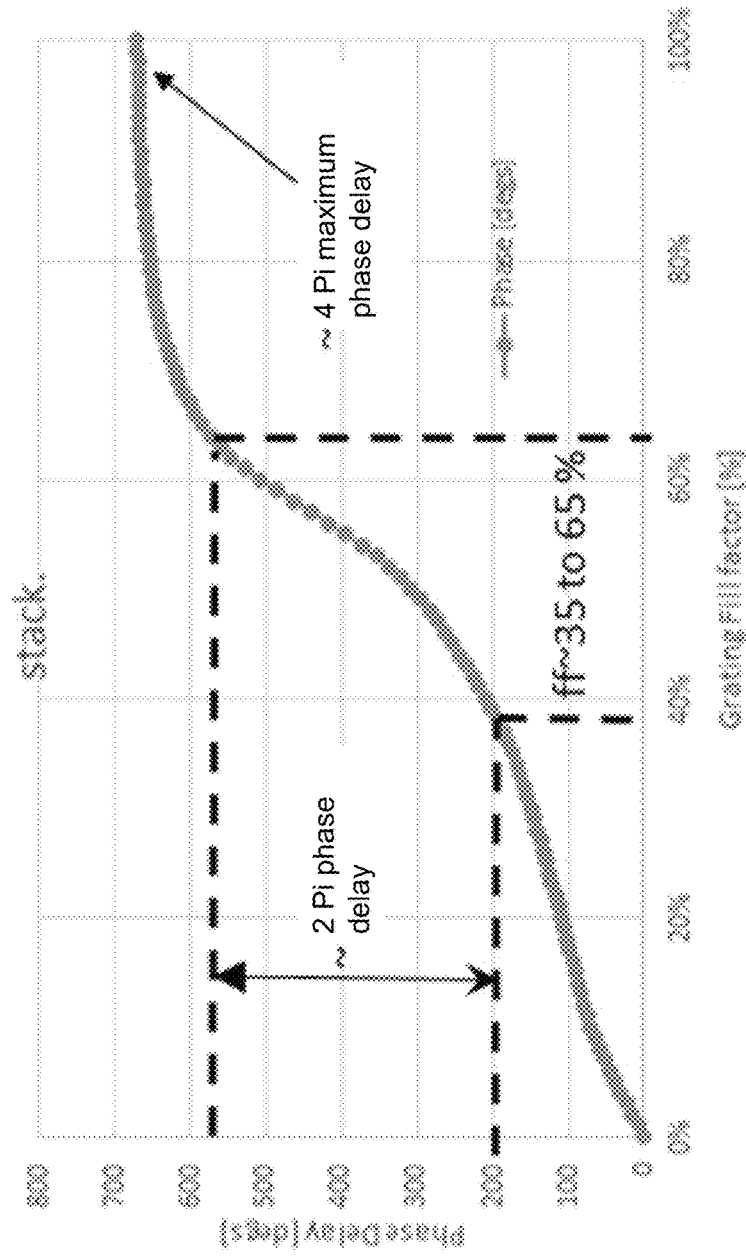

As shown in FIG. 4D, and by diagram 460, a phase delay may be determined for a DOE relative to a fill factor of carrier period of the DOE. In this case, the DOE may be an index-matched two-dimensional sub-wavelength periodic carrier grating with a silicon and silicon dioxide thin layers forming stacks. For example, for a fill factor of between 35% and 65%, a $2\pi$ phase delay may be achieved with a DOE configured for a $4\pi$ maximum phase delay.

As indicated above, FIGS. 4A-4D are provided merely as examples. Other examples are possible and may differ from what was described with regard to FIGS. 4A-4D.

In this way, a carrier grating may provide a sub-wavelength period stack-and-gap structured layers providing transmissive phase delay at a wavelength, such that the sub-wavelength period stack-and-gap structured layers include a set of thin anti-reflection layers that are index matched to an environment or a substrate over a range of fill factors of the sub-wavelength period.

The foregoing disclosure provides illustration and description, but is not intended to be exhaustive or to limit the implementations to the precise form disclosed. Modifications and variations are possible in light of the above disclosure or may be acquired from practice of the implementations.

Some implementations are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, or the like.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A diffractive optical element, comprising:
multiple layers on a surface of a substrate,
wherein the multiple layers include a set of holes defining sub-wavelength periods and providing phase delay,
wherein holes, of the set of holes, have different sizes,
wherein the multiple layers include a set of anti-reflection layers that are index matched to an environment, or the substrate, at each different hole size, and
wherein a transmission efficiency of the diffractive optical element is greater than 85% at each different hole size.

2. The diffractive optical element of claim 1, wherein the set of holes is a set of discrete holes.

3. The diffractive optical element of claim 1, wherein the different sizes of the holes define different fill factors within a range of fill factors of the diffractive optical element.

4. The diffractive optical element of claim 3, wherein the range of fill factors includes at least one fill factor less than 30% fill factor and at least one other fill factor greater than 70% fill factor.

5. The diffractive optical element of claim 1, wherein a hole, of the set of holes, is a particular shape, and wherein the particular shape is at least one of a circle, a square, or a hexagon.

6. The diffractive optical element of claim 1, wherein the set of holes forms a castellated surface in two dimensions coplanar to a top surface of the substrate.

7. The diffractive optical element of claim 1, wherein the set of holes forms a castellated surface in a single dimension coplanar to a top surface of the substrate.

8. The diffractive optical element of claim 1, wherein the set of anti-reflection layers are index matched to the environment and to the substrate over a range of fill factors of the diffractive optical element.

9. The diffractive optical element of claim 1, wherein the transmission efficiency of the diffractive optical element is greater than 95% at each different hole size.

10. The diffractive optical element of claim 1, wherein a maximum transmissive phase delay for a first sub-wavelength period is greater than or equal to $2\pi$ relative to a second sub-wavelength period.

11. The diffractive optical element of claim 10, wherein the first sub-wavelength period is defined by a hole, of the set of holes, at a center of the first sub-wavelength period.

12. The diffractive optical element of claim 1, wherein a maximum transmissive phase delay for a first sub-wavelength period is greater than or equal to $4\pi$ relative to a second sub-wavelength period.

13. The diffractive optical element of claim 12, wherein the first sub-wavelength period is defined by a hole, of the set of holes, at an edge of the first sub-wavelength period.

14. A diffractive optical element, comprising:
multiple layers providing phase delay,
wherein the multiple layers include a set of holes defining sub-wavelength periods,
wherein holes, of the set of holes, have different sizes, and
wherein the multiple layers include a set of anti-reflection layers that are index matched to an environment, or a substrate, over a range of the different hole sizes associated with the set of holes, and
wherein a transmission efficiency of the diffractive optical element is greater than 85% at each different hole size.

15. The diffractive optical element of claim 14, wherein the set of holes are etched into one or more of the multiple layers.

16. The diffractive optical element of claim 14, wherein the set of holes is a set of discrete holes.

17. The diffractive optical element of claim 14, wherein a size of one or more holes, of the set of holes, defines a fill factor, within a range of fill factors, of the diffractive optical element.

18. The diffractive optical element of claim 14, wherein a hole, of the set of holes, is a particular shape, and wherein the particular shape is at least one of a circle, a square, or a hexagon.

19. A diffractive optical element, comprising:
a set of layers including a set of anti-reflection layers,
wherein the set of layers includes discrete gaps etched into the set of layers,
the discrete gaps extending through the set of layers and through the set of anti-reflection layers, and
the discrete gaps include gaps of different sizes,
wherein the set of anti-reflection layers are index matched to an environment, or a substrate, for each different gap size of the discrete gaps, and
wherein a transmission efficiency of the diffractive optical element is greater than 85% at each different gap size.

20. The diffractive optical element of claim 19, wherein the diffractive optical element is disposed on a first side of the substrate and another diffractive optical element is disposed on a second side of the substrate.

* * * * *